(12) United States Patent
Schmidt

(10) Patent No.: US 7,015,563 B2
(45) Date of Patent: Mar. 21, 2006

(54) ON CHIP CAPACITOR

(75) Inventor: Dominik J. Schmidt, Palo Alto, CA (US)

(73) Assignee: Gallitzin Allegheny LLC, Los Altos, CA (US)

( * ) Notice: Subject to any disclaimer, the term of this patent is extended or adjusted under 35 U.S.C. 154(b) by 0 days.

(21) Appl. No.: 10/867,903

(22) Filed: Jun. 14, 2004

(65) Prior Publication Data
US 2004/0224445 A1    Nov. 11, 2004

Related U.S. Application Data

(62) Division of application No. 09/973,621, filed on Oct. 9, 2001.

(51) Int. Cl.
H01L 29/00    (2006.01)

(52) U.S. Cl. ............... 257/516; 257/298; 257/300; 438/210

(58) Field of Classification Search ......... 257/298, 257/300, 516; 438/253
See application file for complete search history.

(56) References Cited

U.S. PATENT DOCUMENTS

| | | | | |
|---|---|---|---|---|
| 3,617,463 A | * | 11/1971 | Gregor et al. | 204/298.31 |
| 4,882,649 A | * | 11/1989 | Chen et al. | 361/313 |
| 4,917,843 A | * | 4/1990 | Gyarmati et al. | 156/151 |
| 5,005,102 A | | 4/1991 | Larson | 361/313 |
| 5,185,689 A | | 2/1993 | Maniar | 361/313 |
| 5,262,920 A | | 11/1993 | Sakuma et al. | 361/321.5 |
| 5,270,251 A | | 12/1993 | Cohen | 438/467 |
| 5,479,316 A | | 12/1995 | Smrtic et al. | 361/322 |
| 5,543,656 A | * | 8/1996 | Yen et al. | 257/530 |
| 5,670,431 A | * | 9/1997 | Huanga et al. | 438/396 |
| 5,973,911 A | | 10/1999 | Nishioka | 361/313 |
| 6,017,791 A | * | 1/2000 | Wang et al. | 438/253 |
| 6,114,714 A | * | 9/2000 | Gangopadhyay | 257/50 |
| 6,230,031 B1 | * | 5/2001 | Barber | 455/571 |
| 6,259,128 B1 | * | 7/2001 | Adler et al. | 257/301 |
| 2002/0060321 A1 | * | 5/2002 | Kazlas et al. | 257/66 |

* cited by examiner

Primary Examiner—Tu-Tu Ho

(57) ABSTRACT

A high capacity silicon capacitor formed on an integrated circuit substrate includes a metal portion on the substrate; a silicon nitride (SiN) portion sputtered on the metal; a silicon (Si) portion sputtered on the silicon nitride portion, another SiN layer and finally a metal layer. The SiN layers are for increased isolation and are optional.

19 Claims, 3 Drawing Sheets

| Metal 208 |
|---|
| SiN 206 |
| Si 204 |
| SiN 202 |
| Metal 200 |

| Metal 208 |
| SiN 206 |
| Si 204 |
| SiN 202 |
| Metal 200 |

FIG. 3

ON CHIP CAPACITOR

This application is a division of U.S. application Ser. No. 09/973,621 filed Oct. 9, 2001, the content of which is incorporated by reference.

BACKGROUND

This invention relates to systems and methods for forming a capacitor in an integrated circuit.

The integration of high value capacitors in integrated circuits is limited by the fact that conventional high value capacitors take up a large areas of on integrated circuit chip, and restrict interconnect routing in the region of the capacitor, thus reducing the device packing density and layout efficiency. Many applications, including telecommunications equipment, require a large number of capacitors, e.g. as coupling/decoupling capacitors and for filters. Often, these must be incorporated as discrete off-chip components, substantially increasing cost, weight, and volume of the peripheral circuitry.

The minimum dimensions of integrated circuit capacitors are determined primarily by the relatively low dielectric constant (e<10), of conventional capacitor dielectrics, e.g. silicon dioxide and silicon nitride. Thus as device dimensions decrease, there is increasing interest in other dielectrics with higher dielectric constants. As discussed in U.S. Pat. No. 5,789,303, ferroelectric materials have large dielectric constants (.about.500), and thus they are also ideally suited as dielectrics for fabrication of integrated circuit capacitors with small dimensions and large capacitance values, e.g. for use as coupling/de-coupling capacitors and as filter elements. However, because ferroelectric materials contain chemical elements not typically found in conventional integrated circuit materials, interdiffusion of elements of the ferroelectric material, heavy metals from the electrode materials, and surrounding materials may occur, causing contamination and degradation of electrical characteristics. This is of particular concern where ferroelectric materials are in close proximity to active devices.

U.S. Pat. No. 6,287,910 to Lee, et al. on Sep. 11, 2001 shows a method for fabricating a capacitor for a semiconductor device by forming a lower electrode on an understructure of a semiconductor substrate; depositing an amorphous TaON thin film over the lower electrode; subjecting the amorphous TaON thin film to a thermal process in an $NH_3$ atmosphere to form a $Ta_3N_5$ dielectric film; and forming an upper electrode on the $Ta_3N_5$ dielectric film. In another embodiment, Lee shows a method for fabricating a capacitor for a semiconductor device, comprising the steps of: forming a lower electrode on an understructure of a semiconductor substrate; forming an amorphous TaON thin film over the lower electrode; subjecting the amorphous TaON thin film to a thermal process in an $NH_3$ atmosphere at a temperature of 600 to 950.degree. C. to form a $Ta_3N_5$ dielectric film; annealing the $Ta_3N_5$ dielectric film; and forming an upper electrode on the $Ta_3N_5$ dielectric film. In another embodiment, Lee provides a method for fabricating a capacitor for a semiconductor device, comprising the steps of: forming a lower electrode on an understructure of a semiconductor substrate; nitriding the lower electrode in an $NH_3$ atmosphere; forming an amorphous TaON thin film over the lower electrode; subjecting the amorphous TaON thin film to a thermal process in an $NH_3$ atmosphere at a temperature of 600 to 950 degree C. to form a $Ta_3N_5$ dielectric film; annealing the $Ta_3N_5$ dielectric film; and forming an upper electrode on the $Ta_3N_5$ dielectric film.

SUMMARY

In one aspect, a silicon capacitor formed on an integrated circuit substrate includes a metal portion on the substrate; a silicon nitride (SiN) portion sputtered on the substrate; and a silicon (Si) portion sputtered on the silicon nitride portion. Another SiN portion can be sputtered on the Si portion; and a metal layer can be deposited on top of the SiN layer.

Advantages of the invention may include one or more of the following. The invention can form high value capacitors on chip. The capacitors are formed using a process that is CMOS compatible, easy to deposit, and inexpensive. Furthermore, the improved dielectric constant provided by the amorphous silicon dielectric film makes it possible to eliminate any additional process steps that had been used to increase the surface area, and thus increase the capacitance, of the lower electrodes. Eliminating these steps reduces the overall process time and cost. Further, the simplified structures, and the resulting simplification of the overall device topography, may result in improvements in subsequent photolithographic and etch processes. The capacitor can be used in a wide variety of applications, including an integrated charge pump, a bypass capacitor, a precision conversion capacitor, and a LC tank frequency generator circuit (wireless) among others.

BRIEF DESCRIPTION OF THE DRAWINGS

The following detailed description of the embodiments can best be understood when read in conjunction with the following drawings, in which:

FIG. 3 shows a second embodiment of a silicon capacitor.

DESCRIPTION

A method for fabricating capacitors for semiconductor devices in accordance with the present invention is described in detail below. In the following description, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
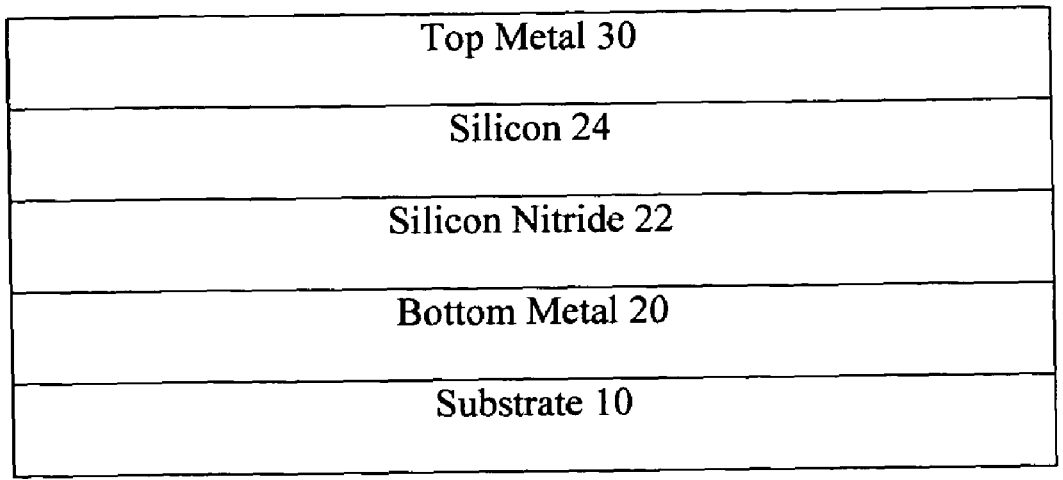
FIG. 1 shows a cross-sectional view of an integrated circuit silicon capacitor.

In fabricating capacitors in accordance with the method of the present invention, a semiconductor substrate 10, which may be a silicon substrate, is first prepared, as shown FIG. 1. Although such structures are not illustrated in the Figures, it will be appreciated that the semiconductor substrate 10 will typically have already undergone extensive processing to create various features and elements that are required to produce a fully functional semiconductor device. These structures will typically include active and isolation regions, doped regions including wells, channel-stops, sources and drains, insulating layers, such as oxides, nitrides, or oxynitrides, and conductive layers such as polysilicon or silicide.

Utilizing photolithography and dry etch processes, a series of contact openings are then formed at predetermined locations to form a bottom metal electrode 20. These contact openings will provide a contact path between predetermined areas of the semiconductor substrate 10 and the lower electrode of the capacitor. Next, a metal portion 20 is deposited on the substrate 10, and a silicon nitride (SiN) portion 22 is sputtered on the metal portion 20 to decrease leakage. Alternatively, other insulating film, such as undoped silicate glass (USG), borophosphosilicate glass (BPSG), or SiON, can be formed or deposited, including those described in U.S. Pat. No. 6,287,910 to Lee, et al. on Sep. 11, 2001. This insulating layer is then planarized, typically using a chemical mechanical polishing (CMP) process, to form an interlayer insulating film.

A silicon (Si) portion 24 is sputtered on the SiN portion 22. In one embodiment, the silicon portion 24 is an amorphous silicon (aSi) layer with a dielectric constant of about 11.7, which is three times the dielectric constant of glass. Since capacitance is a function of area, epsilon, resistance, and dielectric thickness, the amorphous silicon layer allows capacitors to be highly compact. In the amorphous silicon form, silicon is resistive and does not conduct with a resistance in excess of mega-ohms. Thus, for low volt apps, silicon is good material to use in designing capacitors. To illustrate, in certain silicon embodiments where the resistance is on giga-ohm per square micron, a capacitor with a million square microns will have leakage of only one (1) microampere which is acceptable for most applications.

Multiple sandwiched layers with alternating layer(s) of SiN 22 and Si 24 portions can be formed on the substrate 10. The conductive layer 30 such as a metal layer is formed on top of the capacitor to form a lower electrode. Using photolithography and etch processes, the layer of conductive material is selectively patterned and etched to form metal electrodes 32. Each of the metal electrodes 32 incorporates at least one contact opening for providing electrical contact between the electrode and the semiconductor substrate 10.

It is expected that the electrode 30 having a simple planar stack structure will be sufficient to provide sufficient capacitance. Of course, the present invention is equally suitable for use with more complex lower electrode 30 structures such as stepped, cylinder, fin or other three-dimensional configuration.

In this manner, a metal insulator metal (MIM) capacitor can be formed by depositing metal, sputtering silicon nitride (decrease leakage), sputtering Si. Further, a sandwich with a thin layer of SiN and Si, and then a metal layer on top can be added to increase energy storage capacity of the capacitor. Moreover, these layers can be stacked to increase capacity.

Figure 2:
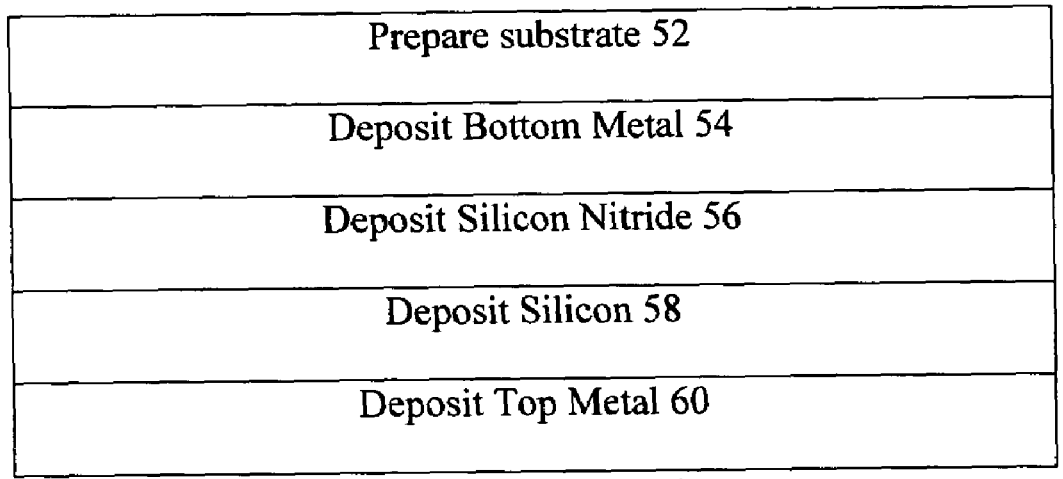
FIG. 2 illustrates an exemplary process for making the silicon capacitor of FIG. 1.

FIG. 2 shows an exemplary process for forming the capacitor of FIG. 1. First, the substrate 10 is prepared (step 52). Next, a bottom layer electrode is deposited (step 54). The silicon nitride 22 is then deposited (step 56), and followed by the deposition of the amorphous silicon 24 (step 58). Multiple sandwiched layers with alternating layer(s) of SiN 22 and Si 24 portions can be formed on the substrate 10. Finally, the metal 30 is deposited (step 60).

Thus the invention provides a method and structure for a cost-effective high capacity on-chip capacitor. Advantageously, the capacitor is well-suited for use in a device such as a mixed signal integrated circuit chip, as well as an electronic system including a processor/memory and analog components such as A/D and D/A converters, imagers and RF circuits.

Figure 3:
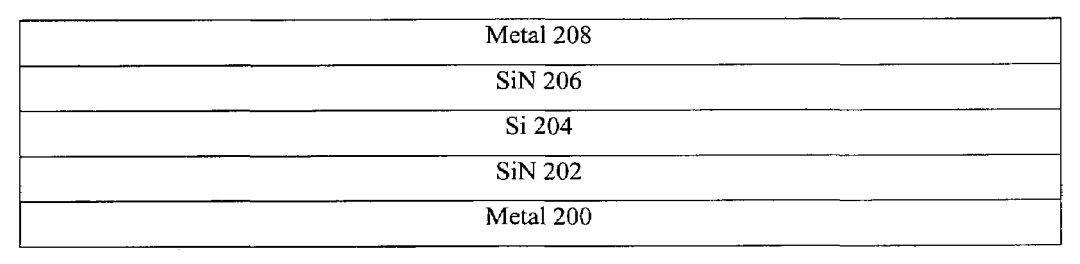

FIG. 3 shows a second embodiment of a silicon capacitor on an integrated circuit substrate. This embodiment includes a metal portion 200 on the substrate; a silicon nitride (SiN) portion 202 sputtered on the metal; a silicon (Si) portion 204 sputtered on the silicon nitride portion, another SiN layer 206 and finally a metal layer 208. The SiN layers 202 and 206 provide increased isolation and are optional. The process for forming the capacitor is as follows:

1. Deposit metal
2. Start sputtering Silicon with nitrogen gas to form a low leakage layer of SiN (202)
3. Remove nitrogen gas flow to deposit pure silicon (204)
4. Add nitrogen gas again to cap the layer off with SiN (which is insulating 206)

This type of capacitor is estimated to have approximately 2.5 times the capacitance of an identical thickness of silicon dioxide (the material currently in use).

Figure 4:
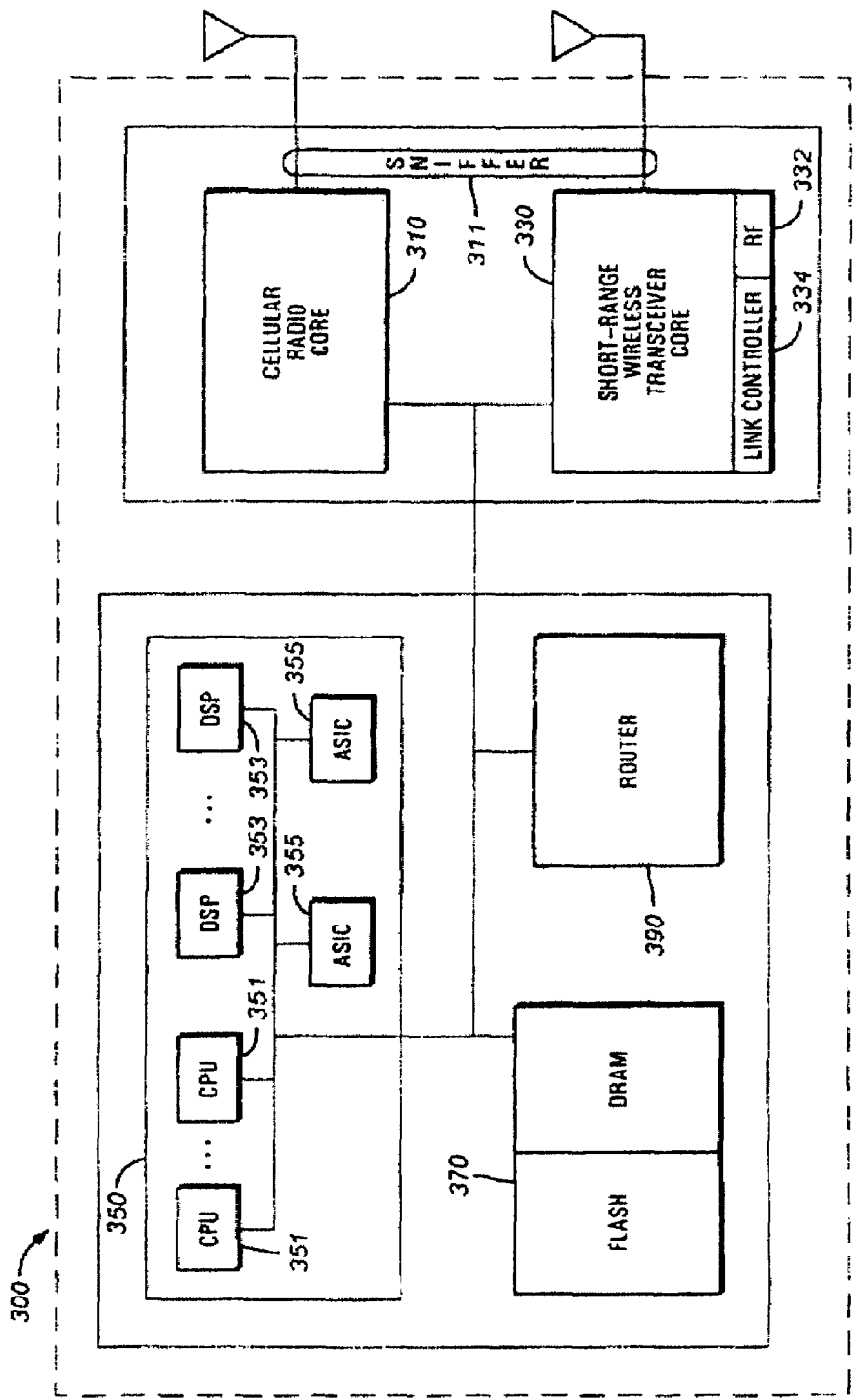
FIG. 4 is a block diagram of a portable appliance using the capacitor of FIG. 1.

The capacitors of FIGS. 1–3 can be used in a mixed mode integrate circuit. FIG. 4 shows a block diagram of a multi-mode wireless communicator device 300 fabricated on a single silicon integrated chip. In one implementation, the device 300 is an integrated CMOS device with an A/D converter, radio frequency (RF) circuits, including a cellular radio core 310, a short-range wireless transceiver core 330, and an RF sniffer 311, along side digital circuits, including a reconfigurable processor core 350, a high-density memory array core 370, and a router 390. The high-density memory array core 370 can include various memory technologies such as flash memory and static random access memory (SRAM), among others, on different portions of the memory array core. Through the router 390, the multi-mode wireless communicator device 300 can detect and communicate with any wireless system it encounters at a given frequency. The router 390 performs the switch in real time through an engine that keeps track of the addresses of where the packets are going. The router 390 can send packets in parallel through two or more separate pathways.

The reconfigurable processor core 350 controls the cellular radio core 310 and the short-range wireless transceiver core 330 to provide a seamless dual-mode network integrated circuit that operates with a plurality of distinct and unrelated communications standards and protocols such as Global System for Mobile Communications (GSM), General Packet Radio Service (GPRS), Enhance Data Rates for GSM Evolution (Edge) and Bluetooth™. The cell phone core 310 provides wide area network (WAN) access, while the short-range wireless transceiver core 330 supports local area network (LAN) access. The reconfigurable processor core 350 has embedded read-only-memory (ROM) containing software such as IEEE802.11, GSM, GPRS, Edge, and/or Bluetooth™ protocol software, among others.

In one embodiment, the cellular radio core 310 includes a transmitter/receiver section that is connected to an off-chip antenna (not shown). The transmitter/receiver section is a direct conversion radio that includes an I/Q demodulator, transmit/receive oscillator/clock generator, multi-band power amplifier (PA) and PA control circuit, and voltage-controlled oscillators and synthesizers. In another embodiment of transmitter/receiver section 312, intermediate frequency (IF) stages are used. In this embodiment, during cellular reception, the transmitter/receiver section converts received signals into a first intermediate frequency (IF) by mixing the received signals with a synthesized local oscillator frequency and then translates the first IF signal to a second IF signal. The second IF signal is hard-limited and processed to extract an RSSI signal proportional to the logarithm of the amplitude of the second IF signal. The hard-limited IF signal is processed to extract numerical values related to the instantaneous signal phase, which are then combined with the RSSI signal.

For voice reception, the combined signals are processed by the processor core 350 to form PCM voice samples that are subsequently converted into an analog signal and provided to an external speaker or earphone. For data reception, the processor simply transfers the data over an input/output (I/O) port. During voice transmission, an off-chip microphone captures analog voice signals, digitizes the signal, and provides the digitized signal to the processor core 350. The processor core 350 codes the signal and reduces the bit-rate for transmission. The processor core 350 converts the reduced bit-rate signals to modulated signals, for example. During data transmission, the data is modulated and the modulated signals are then fed to the cellular telephone transmitter of the transmitter/receiver section.

Turning now to the short-range wireless transceiver core 330, the short-range wireless transceiver core 330 contains a radio frequency (RF) modem core 332 that communicates with a link controller core 334. The processor core 350 controls the link controller core 334. In one embodiment, the RF modem core 332 has a direct-conversion radio architecture with integrated VCO and frequency synthesizer. The RF-unit 332 includes an RF receiver connected to an analog-digital converter (ADC), which in turn is connected to a modem performing digital modulation, channel filtering, AFC, symbol timing recovery, and bit slicing operations. For transmission, the modem is connected to a digital to analog converter (DAC) that in turn drives an RF transmitter.

According to one implementation, when the short-range wireless core 330 in the idle mode detects that the short-range network using Bluetooth™ signals, for example, have dropped in strength, the device 300 activates the cellular radio core 310 to establish a cellular link, using information from the latest periodic ping. If a cellular connection is established and Bluetooth™ signals are weak, the device 300 sends a deregistration message to the Bluetooth™ system and/or a registration message to the cellular system. Upon registration from the cellular system, the short-range transceiver core 330 is turned off or put into a deep sleep mode and the cellular radio core 310 and relevant parts of the synthesizer are powered up to listen to the cellular channel.

The router 390 can send packets in parallel through the separate pathways of cellular or Bluetooth™. For example, if a Bluetooth™ connection is established, the router 390 knows which address it is looking at and will be able to immediately route packets using another connection standard. In doing this operation, the router 390 pings its environment to decide on optimal transmission medium. If the signal reception is poor for both pathways, the router 390 can send some packets in parallel through both the primary and secondary communication channel (cellular and/or Bluetooth™) to make sure some of the packets arrive at their destinations. However, if the signal strength is adequate, the router 390 prefers the Bluetooth™ mode to minimize the number of subscribers using the capacity-limited and more expensive cellular system at any give time. Only a small percentage of the device 300, those that are temporarily outside the Bluetooth coverage, represents a potential load on the capacity of the cellular system, so that the number of mobile users can be many times greater than the capacity of the cellular system alone could support. All the above implementations have circuits combining low noise devices with high-speed, high-noise digital transistors on the same silicon substrate. By using the present invention on the digital transistors closest to the low-noise sections, the impact of the generated noise can be greatly reduced.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for forming a silicon capacitor, comprising:
   depositing a metal portion on a substrate;
   sputtering silicon with nitrogen gas to form a silicon nitride (SiN) portion directly on the metal portion;
   removing nitrogen gas flow and sputtering a silicon (Si) portion on the SiN portion.

2. The method of claim 1, further comprising forming a sandwich with a plurality of layers of SiN and Si.

3. The method of claim 2, further comprising developing a metal layer adjacent to the sandwich.

4. The method of claim 1, wherein the silicon nitride decreases leakage.

5. The method of claim 1, further comprising depositing a second silicon nitride portion.

6. The method of claim 1, further comprising depositing a second metal portion.

7. The method of claim 1, further comprising:
   adding nitrogen gas again to cap the Si portion with SiN; and
   depositing metal on the SiN cap.

8. The method of claim 1, further comprising forming a layer of SiN comprising the SiN portion and a layer of Si comprising the Si portion, wherein each of the layers of SiN and Si formed is approximately forty angstroms thick.

9. A method for forming a silicon capacitor, comprising:
   depositing a first metal portion on a substrate;
   sputtering an insulator portion directly on the metal portion, the insulator portion comprising a sandwich formed with a plurality of alternating silicon nitride (SiN) and silicon (Si) layers; and
   depositing a second metal portion directly on the insulator portion.

10. The method of claim 9, wherein the Si portion comprises amorphous silicon.

11. The method of claim 9, further comprising forming the silicon capacitor on an integrated circuit having an analog portion and a digital portion.

12. The method of claim 11, wherein the integrated circuit comprises a multi-mode wireless communication device.

13. A method of forming a silicon capacitor comprising:
   depositing a first metal portion on a substrate;
   forming a first silicon nitride (SiN) portion directly over the first metal portion;
   forming a silicon (Si) portion directly over the first SIN portion;
   forming a second SiN portion directly over the Si portion; and
   forming a second metal portion directly over the second SiN portion to form the silicon capacitor for storing charge in an integrated circuit.

14. The method of claim 13, wherein forming the first SiN portion comprises sputtering silicon with nitrogen gas.

15. The method of claim 13, further comprising forming the silicon capacitor using a complementary metal oxide semiconductor (CMOS) process.

16. The method of claim 13, further comprising forming the silicon capacitor on a mixed signal integrated circuit.

17. The method of claim 13, further comprising forming a sandwich layer formed of a SiN layer and a Si layer on the Si portion.

18. The method of claim 13, further comprising:
forming a second Si portion directly over the second SiN portion; and
forming a third SiN portion directly over the second Si portion.

19. The method of claim 13, wherein the silicon capacitor has a capacitance substantially greater than a similarly sized capacitor formed of silicon dioxide.

* * * * *